United States Patent [19]

Matsumoto

[11] Patent Number: 5,093,683
[45] Date of Patent: Mar. 3, 1992

[54] APPARATUS FOR FORMING AN IMAGE SHEET WITH ADHESIVE TAPE

[75] Inventor: Yumio Matsumoto, Kasugai, Japan

[73] Assignee: Brother Kogyo Kabushiki Kaisha, Nagoya, Japan

[21] Appl. No.: 630,184

[22] Filed: Dec. 19, 1990

[30] Foreign Application Priority Data

May 16, 1990 [JP] Japan .................. 2-127762

[51] Int. Cl.⁵ .................. G03B 27/52
[52] U.S. Cl. .................. 355/27
[58] Field of Search .................. 355/27, 28

[56] References Cited

U.S. PATENT DOCUMENTS 4,399,209 8/1983 Sanders et al. .................. 430/138
4,841,338 6/1989 Suzuki .................. 355/27

*Primary Examiner*—L. T. Hix
*Assistant Examiner*—Howard B. Blankenship
*Attorney, Agent, or Firm*—Oliff & Berridge

[57] ABSTRACT

In an apparatus for forming an image sheet with adhesive tape, a roll type photosensitive pressure sensitive sheet, a developer sheet and a adhesive tape are stored. A latent image is formed on a surface of the photosensitive pressure sensitive sheet based on image information from outside, and a visible image is formed on the developer sheet by superposing the photosensitive pressure sensitive sheet and the developer sheet, and applying pressure. The visible image formed on the developer sheet is fixed, and adhesive tape is affixed onto the developer sheet for output. The image sheet outputted therefrom can be used for a seal or the like.

20 Claims, 1 Drawing Sheet

APPARATUS FOR FORMING AN IMAGE SHEET WITH ADHESIVE TAPE

BACKGROUND OF THE INVENTION

1. Filed of the Invention

The present invention relates to an apparatus which makes an image sheet with an adhesive tape, and more particularly relates to an apparatus which makes an image sheet using a photosensitive sheet and a developer sheet, affixes an adhesive tape thereon, and makes an image sheet with an adhesive tape.

2. Description of Related Art

In one conventional image forming apparatus, a transfer-type recording medium which uses a photosensitive microcapsule sheet and a developer sheet is used.

The photosensitive microcapsule sheet is provided with microcapsules which encapsulate therein a chromogenic material or dye precursor having first and second phases dependent on light exposure.

The developer sheet is provided with a developer material which provides an output image upon reaction with the chromogenic material.

Such image forming medium is disclosed in, for example, U.S. Pat. No. 4,399,209. As is well known, image forming apparatuses which use the transfer-type recording mediums irradiate an original with light and the light reflected from the original or transmitted therethrough passes through an optical system such as a reflection mirror, a filter and lenses, and is focused onto the photosensitive microcapsule sheet.

As a result, a latent image is formed on the photosensitive microcapsule sheet upon photocuring of the light exposed microcapsules.

Then, the light-exposed photosensitive microcapsule sheet is superposed with the developer sheet, and these sheets are pressed together at a pressure developing unit, so that non-photocured microcapsules are ruptured to permit the chromogenic material to react with the developer material, to thereby provide an output image on the developer sheet. After the pressure developing operation, the developer sheet is delivered to a thermal fixing unit where the output image is thermally fixed and a glossy output image is obtained.

In such an image recording apparatus, it may be requested that the developer sheet on which the image is formed will be used as a seal. In this case, it was necessary to affix an adhesive tape to the developer sheet on which the image is formed manually or to provide a mechanism for affixing the adhesive tape on the developer sheet in the image forming apparatus. However, the structure of such an image forming apparatus became complex and was not easy to operate.

SUMMARY OF THE INVENTION

Accordingly, it is an object of the present invention to overcome the above problems and to provide an apparatus which makes an image sheet with an adhesive tape suitable for sealing and the like by affixing an adhesive tape onto an output image.

It is another object of the present invention to provide a cassette-type image sheet-making apparatus holding adhesive tape, the apparatus being on an image forming apparatus, by which an image sheet with adhesive tape attached thereto in accordance with image information thereon is obtained.

It is a further object of the present invention to provide a compact seal making device with a roll type photosensitive pressure sensitive sheet, a developer sheet, and an adhesive sheet.

These objects are attained by providing an image forming apparatus for making out an image sheet with adhesive tape comprising: an exposure part which: 1) stores a roll-type photosensitive pressure sensitive sheet having a photosensitive material side and a roll type developer sheet having a developer material side in a cassette main body, the photosensitive material side and the developer material side being drawn out therefrom in superposing and confronting relationship, and 2) exposes the photosensitive pressure sensitive sheet according to an image information so as to form thereon a latent image; a pressure development part for applying pressure to the photosensitive pressure sensitive sheet where the latent image is formed thereon superposed with the developer sheet so as to cause a chemical reaction with the developer material and to thereby develop the latent images to the visible images; a fixing part for fixing the visible image formed on the developer sheet developed in the pressure development part; an adhesive tape affixing part for affixing an adhesive tape on the developer sheet output from the fixing part; and a sheet output part for outputting the image sheet having the adhesive tape affixed thereto.

According to an image forming apparatus of the present invention, the photosensitive pressure sensitive sheet and the developer sheet stored in the cassette main body are drawn out such that superposing and confronting the photosensitive material side and the developer material side are superimposing and confronting one another, and are exposed in the exposure part, and the latent image based on the image information is formed on the photosensitive pressure sensitive sheet. Next, the latent image formed on the photosensitive pressure sensitive sheet is applied a pressure and is developed on the developer sheet in the pressure development part. Then, the image developed on the developer sheet in the pressure development part is fixed in the fixing part. Next, the roll-type adhesive tape is affixed on the developer sheet and is drawn out from the cassette main body with said developer sheet. The image sheet where the adhesive tape is thus affixed can be used as a seal.

As mentioned above, the photosensitive pressure sensitive sheet and the developer sheet for the image formation, and the adhesive tape for outputting the developer sheet on which the image is formed as a seal are stored in the cassette main body.

Therefore, it becomes unnecessary to install a complex mechanism for affixing the adhesive tape to the developer sheet in the image forming apparatus, and to affix the adhesive tape on the developer sheet manually. The image sheet on which the adhesive tape is affixed like a seal can be made easily.

There is an advantage that the handling of this apparatus is easy, and that this apparatus can be used many times if the used photosensitive pressure sensitive sheet is replaced and the developer sheet and the adhesive tape are newly installed in the cassette main body.

BRIEF DESCRIPTION OF THE DRAWINGS

The invention will be described in detail with reference to the following drawings, wherein.

DETAILED DESCRIPTION OF THE PREFERRED EMBODIMENTS

A detailed description of a preferred embodiment of the present invention will now be provided with reference referring to the accompanying drawings.

Figure 1:
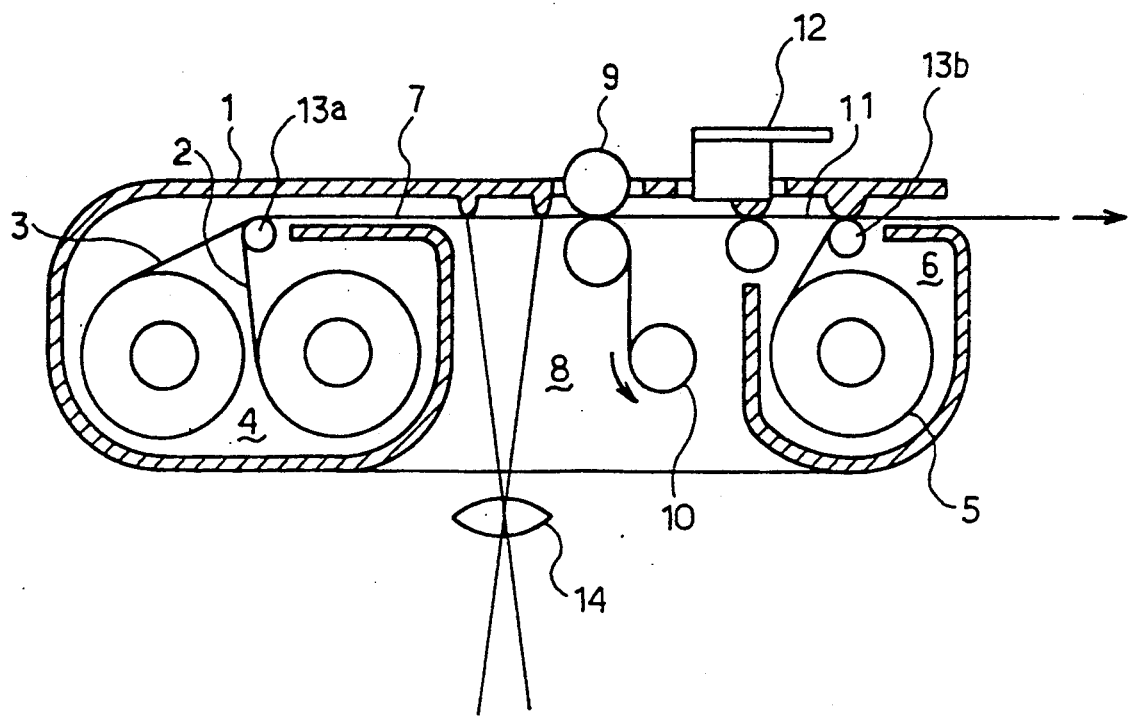
FIG. 1 is a sectional view showing the apparatus for making-out the image sheet with the adhesive tape of the preferred embodiment of the present invention.

The constitution of a sheet cassette apparatus 1 for image formation (hereinafter called a cassette main body) is disclosed in FIG. 1. The cassette main body 1 consists of shielding material and the main part is structured to prevent ambient light therein. A sheet storage part 4 where a roll type photosensitive pressure sensitive sheet 2 and a developer sheet 3 are stored, and a tape storage part 6 where an adhesive double coated tape 5 is stored, are installed in the cassette main body 1. The photosensitive pressure sensitive sheet 2 and the developer sheet 3 are superposed and are drawn out from the sheet storage part 4 as an image formation sheet 7.

Between the sheet storage part 4 and the tape storage part 6, there are an exposure part 8 where the image formation sheet 7 is exposed, a pressure development part 9 where a latent image formed on the photosensitive pressure sensitive sheet 2 in the exposure part 8 is applied pressure and is developed, a take-up reel 10 for winding up the separated photosensitive pressure sensitive sheet 2 from the developer sheet 3 after being developed under pressure, and a thermal fixing part 12 where the image developed on the developer sheet 3 is fixed by heat and an output image sheet 11 is made.

The sheet storage part 4 and the tape storage part 6 include a guide roller 13a for making the image formation sheet 7 by confronting and superposing the photosensitive pressure sensitive sheet 2 and the developer sheet 3, and a guide roller 13b for affixing the adhesive double coated tape 5 onto the output image sheet 11 by confronting and superposing the adhesive tape 5 and the output image sheet 11.

Moreover, a lens 14 is provided in front of the exposure part 8, and data from a data memory device (not shown) is exposed to the image formation sheet 7 through the lens 14.

Next, the operation for affixing the adhesive double coated tape 5 to the output image sheet 11 on which the predetermined image is formed and for discharging the image sheet with adhesive tape from the cassette main body 1 will be described.

Figure 2:
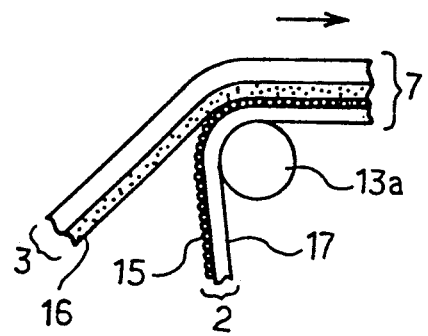
FIG. 2 is a enlarged sectional view showing the area where the photosensitive pressure sensitive sheet and the developer sheet are superposed.

As shown in FIG. 2, the roll type photosensitive pressure sensitive sheet 2 and the developer sheet 3 stored in the sheet storage part 4 are confronted and superposed with respect to each other by the guide roller 13a and are drawn out from the sheet storage part 4 as the image formation sheet 7. A photosensitive material side 15 of the photosensitive pressure sensitive sheet 2 and a developer material side 16 of the developer sheet 3 are overlapped by the guide roller 13a and the image formation sheet 7 is made. A substrate 17 of the photosensitive pressure sensitive sheet 2 consists of a transparent material so as to expose the photosensitive pressure sensitive sheet 2 from a back side of the substrate 17 thereof.

The image formation sheet 7 drawn out from the sheet storage part 4 is exposed from the side of the substrate of the photosensitive pressure sensitive sheet 2 by the light which passes through the lens 14 in the exposure part 8, and the latent image is formed. Next, the latent image formed on the part of the photosensitive pressure sensitive sheet 2 of the image formation sheet 7 is developed under pressure in the pressure development part 9. Further, the photosensitive pressure sensitive sheet 2 of the image formation sheet 7 is wound up to the take-up reel 10 and the developer sheet 3 is separated. The separated developer sheet 3 is transported to the thermal fixing part 12, and is thermal fixed for forming the output image sheet 11. The output image sheet 11 passes through the tape storage part 6, is affixed with the adhesive double coated tape 5 by the guide roller 13b therein, and is discharged from the cassette main body 1. The output image sheet 11 can be used as a seal.

The output image sheet 11 where the image is formed and the adhesive double coated tape 5 is affixed thereto as mentioned above, is discharged from the image forming apparatus and can be used as a seal instantly.

The present invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An apparatus for forming an image sheet with an adhesive tape comprising:

a cassette body;

a sheet storage means for storing and drawing out a roll-type photosensitive pressure sensitive sheet and a developer sheet in said body;

a tape storage means for storing a roll type adhesive tape;

an exposure means for exposing a surface of the photosensitive pressure sensitive sheet drawn out from said sheet storage means to image information from outside for forming a latent image;

a pressure development means for superposing the developer sheet drawn out from said sheet storage means and a latent imaging part of the photosensitive pressure sensitive sheet on which the latent image is formed in said exposure means so as to form on the developer sheet a visible image;

a fixing means for fixing the visible image formed on the developer sheet in said pressure development means;

an affixing means for drawing out the adhesive tape from said adhesive tape storage means, and for affixing the adhesive tape to the developer sheet on which the visible image is fixed in said fixing means, thereby forming an image sheet; and an output means for outputting an image sheet formed by affixing the adhesive tape to the developer sheet in said affixing means.

2. The apparatus according to claim 1, wherein the body comprises of a light shielding material.

3. The apparatus according to claim 1, wherein the photosensitive pressure sensitive sheet has a substrate and photosensitive microcapsules containing a dye-precursor, the microcapsules being coated on the photosensitive pressure sensitive sheet substrate, and the developer sheet has a substrate and a developer which causes a chromogenic reaction with the dye-precursor, the developer being coated on the developer sheet substrate.

4. The apparatus according to claim 3, wherein the substrate of the photosensitive pressure sensitive sheet is made from a transparent material.

5. The apparatus according to claim 4, wherein a microcapsule coating side of the photosensitive pressure sensitive sheet and a developer coating side of the developer sheet are superposed and are exposed from an opposite side of the photosensitive pressure sensitive sheet.

6. The apparatus according to claim 1, wherein said exposure means has a lens which focuses image information light from the outside onto the surface of the photosensitive pressure sensitive sheet.

7. The apparatus according to claim 1, wherein the adhesive tape is an adhesive double-coated tape.

8. The apparatus according to claim 3, wherein the adhesive tape is an adhesive double-coated tape.

9. The apparatus according to claim 8, wherein the adhesive tape is affixed to the side of the developer sheet having the developer coating thereon, the developer substrate being made from a transparent material.

10. The apparatus according to claim 1, further comprising a separation means for separating the photosensitive pressure sensitive sheet from the developer sheet discharged from said pressure development means, said separation means being provided between said pressure development means and said fixing means.

11. The apparatus according to claim 10, further comprising a take-up means for winding the photosensitive pressure sensitive sheet separated from the developer sheet by said separation means, said take-up means being provided in the body.

12. An apparatus for forming an image sheet with an adhesive tape comprising:
 a sheet drawing means for drawing out a photosensitive pressure sensitive sheet and a developer sheet, the photosensitive pressure sensitive sheet being exposed to image information to form a latent image;
 a tape storage means for storing a roll type adhesive tape;
 a pressure development means for superposing the developer sheet drawn out from said sheet drawing means and a latent imaging part of the photosensitive pressure sensitive sheet on which the latent image is formed so as to form on the developer sheet a visible image;
 a fixing means for fixing the visible image formed on the developer sheet in said pressure development means;
 an affixing means for drawing out the adhesive tape from said adhesive tape storage means, and for affixing the adhesive tape to the developer sheet on which the visible image is fixed in said fixing means, thereby forming an image sheet; and
 an output means for outputting an image sheet formed by affixing the adhesive tape to the developer sheet in said affixing means.

13. The apparatus according to claim 12, wherein the photosensitive pressure sensitive sheet has a substrate and photosensitive microcapsules containing a dye-precursor, the microcapsules being coated on the photosensitive pressure sensitive sheet substrate, and the developer sheet has a substrate and a developer which causes a chromogenic reaction with the dye-precursor, the developer being coated on the developer sheet substrate.

14. The apparatus according to claim 13, wherein the substrate of the photosensitive pressure sensitive sheet is made from a transparent material.

15. The apparatus according to claim 14, wherein a microcapsule coating side of the photosensitive pressure sensitive sheet and a developer coating side of the developer sheet are superposed and are exposed from an opposite side of the photosensitive pressure sensitive sheet.

16. The apparatus according to claim 12, wherein the adhesive tape is an adhesive double-coated tape.

17. The apparatus according to claim 13, wherein the adhesive tape is an adhesive double-coated tape.

18. The apparatus according to claim 17, wherein the adhesive tape is affixed to the side of the developer sheet having the developer coating thereon, the developer substrate being made from a transparent material.

19. The apparatus according to claim 12, further comprising a separation means for separating the photosensitive pressure sensitive sheet from the developer sheet discharged from said pressure development means, said separation means being provided between said pressure development means and said fixing means.

20. The apparatus according to claim 19, further comprising a take-up means for winding the photosensitive pressure sensitive sheet separated from the developer sheet by said separation means, said take-up means being provided in the body.

* * * * *